United States Patent [19]

Nigel

[11] Patent Number: 5,812,008
[45] Date of Patent: Sep. 22, 1998

[54] LOGARITHMIC CONVERTER

[75] Inventor: Toll John Nigel, Cambridge, Great Britain

[73] Assignee: Nokia Telecommunications Oy, Espoo, Finland

[21] Appl. No.: 793,968

[22] PCT Filed: Jul. 8, 1996

[86] PCT No.: PCT/GB96/01616

§ 371 Date: May 6, 1997

§ 102(e) Date: May 6, 1997

[87] PCT Pub. No.: WO97/04523

PCT Pub. Date: Feb. 6, 1997

[30] Foreign Application Priority Data

Jul. 14, 1995 [GB] United Kingdom .................. 9514490

[51] Int. Cl.$^6$ ................................................. H03G 11/08
[52] U.S. Cl. ........................................ 327/350; 327/561
[58] Field of Search ................................... 327/350, 352, 327/346, 560, 561, 563

[56] References Cited

U.S. PATENT DOCUMENTS

| 3,790,819 | 2/1974 | Chamran | 327/352 |
| 4,709,215 | 11/1987 | McClanahan et al. | 330/43 |
| 5,004,906 | 4/1991 | Takasaki et al. | 250/214 A |
| 5,012,140 | 4/1991 | Bateman | 327/350 |
| 5,014,013 | 5/1991 | Kotzian | 327/350 |
| 5,528,191 | 6/1996 | Yasuda | 327/350 |

FOREIGN PATENT DOCUMENTS

| 1 258 100 | 3/1988 | European Pat. Off. . |
| 26 19 192 | 11/1977 | Germany . |

OTHER PUBLICATIONS

Patent Abstracts of Japan, vol. 16, No. 420(E–1259), JP4144305, Fujitsu Ltd.

*Primary Examiner*—Toan Tran
*Attorney, Agent, or Firm*—Perman & Green, LLP

[57] ABSTRACT

A power control circuit (10) contains a voltage controlled attenuator (16) in combination with a logarithmic converter (24) to produce linear amplification of an input signal (12) over as wide a frequency output range. A logarithmic converter for use in such a power control circuit is provided, including an amplifying circuitry (60) with a non-inverting (66) and inverting (70) input and an output (64), and two feedback circuits (62, 68). The feedback circuits are separably connected between the output and an input of the amplifying circuitry, so that the first feedback circuitry (62) produces a feedback signal which results in the amplifying circuitry (60) exhibiting a non-linear characteristic and the second feedback circuitry (68) contains at least one reactive element (108) to limit the feedback signal from the first feedback circuitry (62) above certain signal levels.

10 Claims, 3 Drawing Sheets

LOG. CONVERTER CHARACTERISTIC

LOGARITHMIC CONVERTER

This invention relates to improvements to a logarithmic converter which may be used within a closed loop power control circuit.

Transmitters for GSM (Global System for Mobile Communications) and DCS (Digital Cellular System) communication systems require amplification of input power over a closed loop power control circuit to produce output power over a dynamic range of at least 30 dB. To ensure that amplification is possible over as wide a range of input frequencies as possible, a power circuit with a linear gain characteristic is required.

Typically amplification of input power is achieved by the use of a variable attenuation element in the power control circuit. Such devices have a gain characteristic that is approximately dB linear, i.e. an input voltage into the device undergoes exponential gain to produce an output voltage. Therefore use of a compensating element is required to ensure that a linear gain characteristic is achieved in the power control circuit.

It is well known that a non-linear product of an operational amplifier can be linearised by placing a similar non-linearity into the feedback path of the operational amplifier. Linearisation of the power gain produced by voltage controlled attenuators has been achieved similarly by using an element with a similar non-linear gain characteristic placed into a feedback path to the voltage controlled attenuator. A suitable non-linear element is a logarithmic converter which typically uses the exponential current versus voltage characteristic of a p-n junction, such as may be provided by a diode.

The general aim of the invention is to provide a further logarithmic converter for use in a closed loop power control circuit.

According to the invention a logarithmic converter for use in a closed loop power control circuit, comprises amplifying means for amplifying an input signal, the amplifying means including at least non-inverting and inverting inputs and an output, and two feedback means, separably connected between the output and an input of the amplifying means, wherein the first feedback means produces a feedback signal which results in the amplifying means exhibiting a non-linear gain characteristic and the second feedback means contains at least one reactive element operable above a given input level, so that in use the second feedback means acts to limit the feedback signal from the first feedback means above certain signal levels.

This allows the gain characteristic produced by the first feedback means to be available over a larger range of input signal values, particularly when an alternating input signal is supplied.

The logarithmic converter may produce either a non-inverting gain or an inverting gain. Connection of the first feedback means determines the gain characteristic, with connection of the first feedback means between the output of the amplifying means to the non-inverting input resulting in a non-inverting gain. It will be understood that an inverting gain characteristic will be achieved by connection of the first feedback means between the output of the amplifying means and the inverting input.

The first feedback means preferably comprises reactive components including further amplification means. The further amplification means may be provided by an emitter coupled pair of transistors. The transistors may be n-p-n or p-n-p doping combinations.

In a further embodiment of the invention, the further amplification means may be provided by two Darlington transistor pairs, wherein each Darlington pair is coupled to the other by the unconnected emitters of the Darlington pairs, so as to produce a logarithmic converter where movement of a temperature independent point of the gain characteristic of the logarithmic converter is permitted.

The reactive element of the second feedback means is preferably a zener diode. This acts to contain large increases in conversion gain at higher output voltages.

The second feedback means may further be provided with at least one resistive element and at least one capacitive element to allow suppression of unwanted feedback from outside the second feedback means.

The logarithmic converter may be used in a power control loop circuit with a voltage controlled variable attenuation element, so as to achieve linear gain of output power over input power. Resistive elements in series with each emitter junction of the transistors in the first feedback means may be used to equalise the sensitivity of the logarithmic converter to the sensitivity of a voltage controlled attenuation element with which it is to be used.

In a further embodiment of the invention, the first feedback means may comprise a combination of one way current flow devices, such as diodes.

A logarithmic converter embodying the invention will now be described, by way of example, with reference to the accompanying drawings in which.

DESCRIPTION OF EMBODIMENTS

Figure 1:
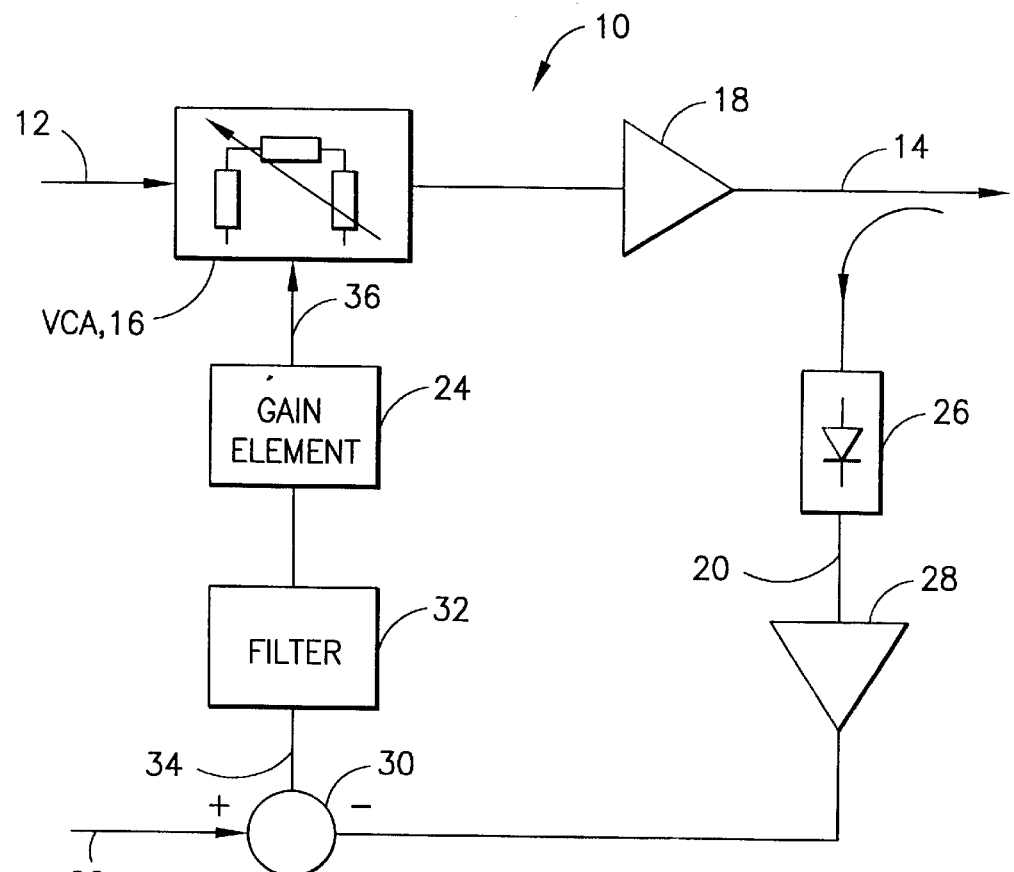
FIG. 1 is a schematic diagram of a closed loop power control circuit including a logarithmic converter in accordance with the invention.

FIG. 1 shows a schematic diagram of a power control loop circuit 10 including a logarithmic converter in accordance with the invention. The power control circuit 10 is used to amplify a radio frequency input voltage and provide a radio frequency output. Typically, these power control circuits are used in base station transmitters for transmitting radio frequencies. In FIG. 1, modulated signal 12 derived from a radio frequency source is input into the power control circuit 10. The power control circuit 10 amplifies the modulated signal 12 to produce an output signal 14. The circuit 10 comprises a voltage controlled attenuator(VCA) 16, a power amplifier 18 and a feedback loop 20. The VCA 16 is supplied with a power control voltage 22 to enable operation. The power control voltage 22 is modified by combination with a signal from the feedback loop 20.

Figure 2:
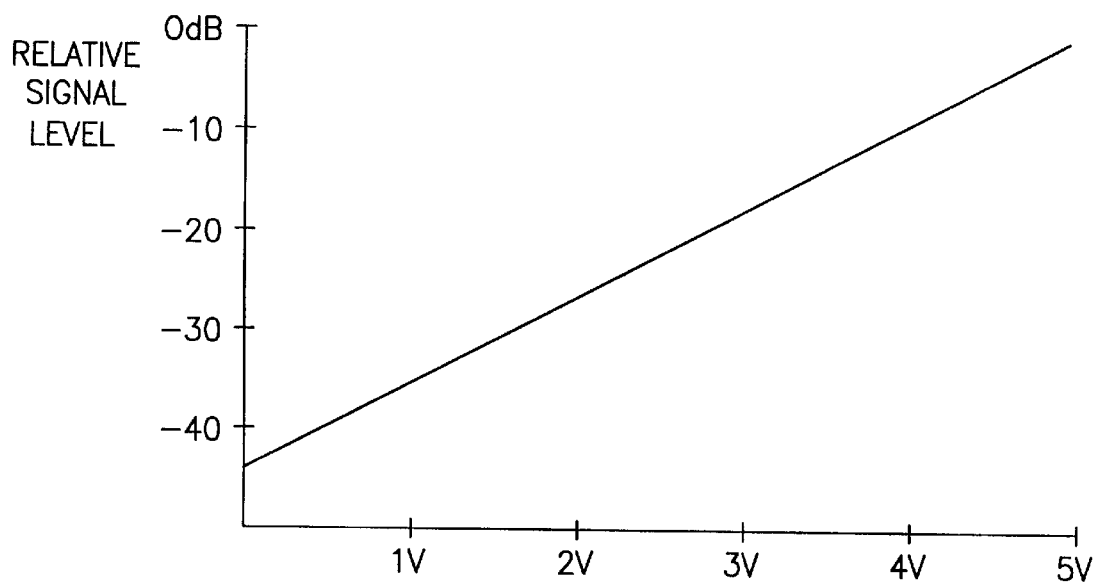
FIG. 2 is a graph of the gain characteristic of a voltage controlled attenuator used in the power control circuit.
Figure 3:
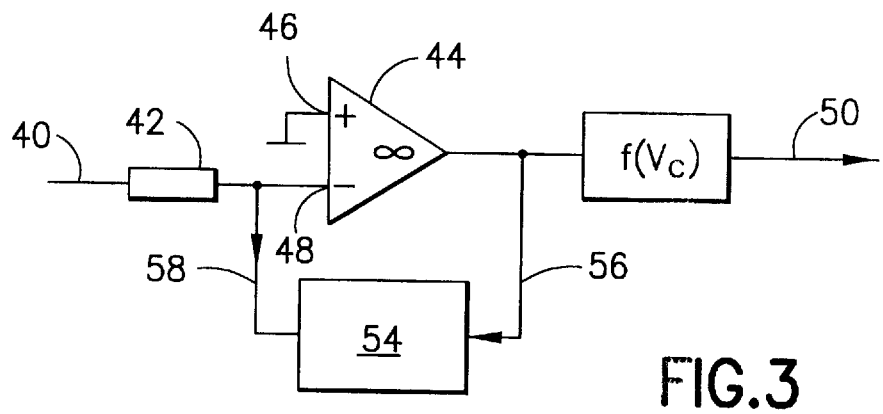
FIG. 3 is a schematic diagram useful for explaining the use of a feedback path to achieve a linear gain in a circuit containing an amplifier with a non-linear gain.

The VCA 16 has a gain characteristic which is approximately dB linear as shown in FIG. 2, with the input voltage in volts along the x axis and the relative output signal level in dB along the y axis. This is a non-linear gain and can be linearised by use of a feedback path. FIG. 3 shows a diagram useful for explaining the use of a feedback path to achieve linearisation, where an input voltage 40 is input into a circuit containing a resistor 42, an operational amplifier 44 with a non-inverting input 46 and an inverting input 48 so as to produce an amplified output signal 50.

The gain of the operational amplifier 44 is non-linear; accordingly a non-linear output signal 50 is produced. The signal 50 may be characterised as a function of the output voltage($V_c$) 52 from the operational amplifier 44, i.e. as $f(V_c)$. To linearise the signal 50, a similar non-linearity 54 is placed in a feedback path 56 of the operational amplifier 44. The non-linearity 54 produces an output current 58 which can be represented as $c.f(V_c)$, where c is some arbitrary constant. Such a non-linearity in the feedback path 56 results in a linear output signal 50.

Figure 4:
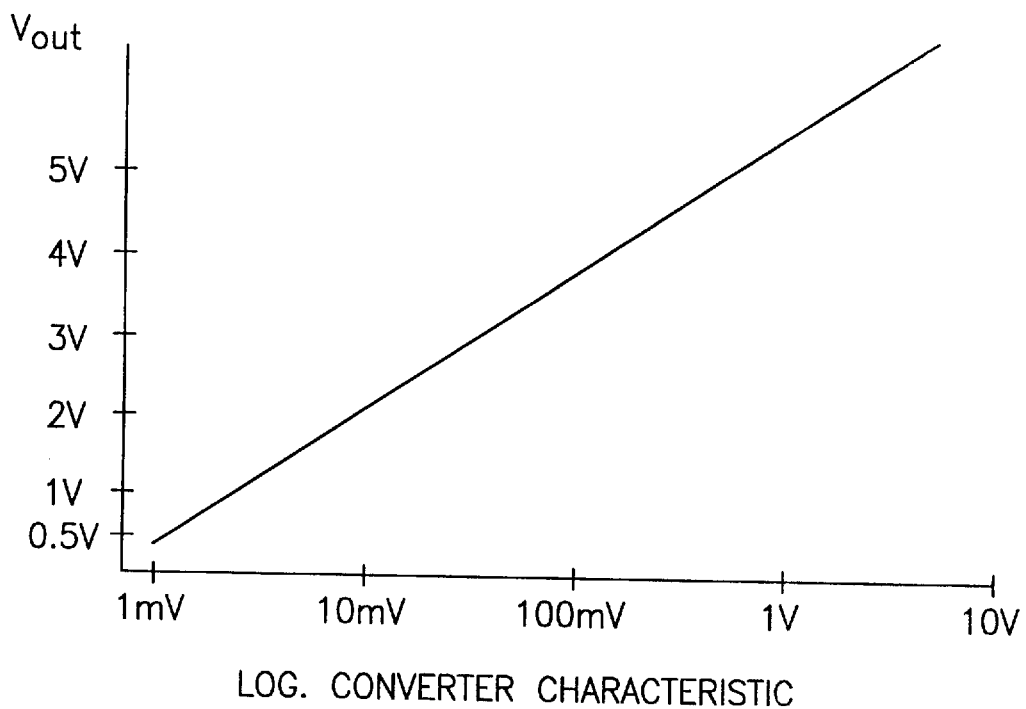
FIG. 4 is a graph of the gain characteristic of a logarithmic converter in accordance with the invention.

In a similar way in the power control circuit 10 a gain element 24 is placed into the feedback path 20 to ensure that amplification of the input signal 12 is linear with respect to voltage. The gain element 24 has a gain characteristic matching that of the VCA 16, i.e. a linear dB gain. This gain characteristic is shown in FIG. 4, with the input voltage along the x axis and the output voltage in volts along the y axis. Typically the gain element 24 is a logarithmic converter.

The feedback loop 20 comprises a diode 26, a buffer 28, a combining device 30, a loop filter 32 and the logarithmic converter 24. The amplified signal from the VCA 16 is fed to a power amplifier 18 which produces the output signal 14. The feedback loop 20 uses the output signal from the power amplifier 18 to produce a feedback signal for combination with the power control voltage 22.

The combined signal 34 is fed to the loop filter 32 and thence to the logarithmic converter 24. The logarithmic converter 24 produces an output signal 36 which has a linear dB gain characteristic over the input signal fed into the logarithmic converter 24. The output signal 36 is used as the direct control voltage to the VCA 16. In this way the non-linear gain of the VCA 16 is compensated for, so that the power control circuit 10 has a linear gain.

Figure 5:
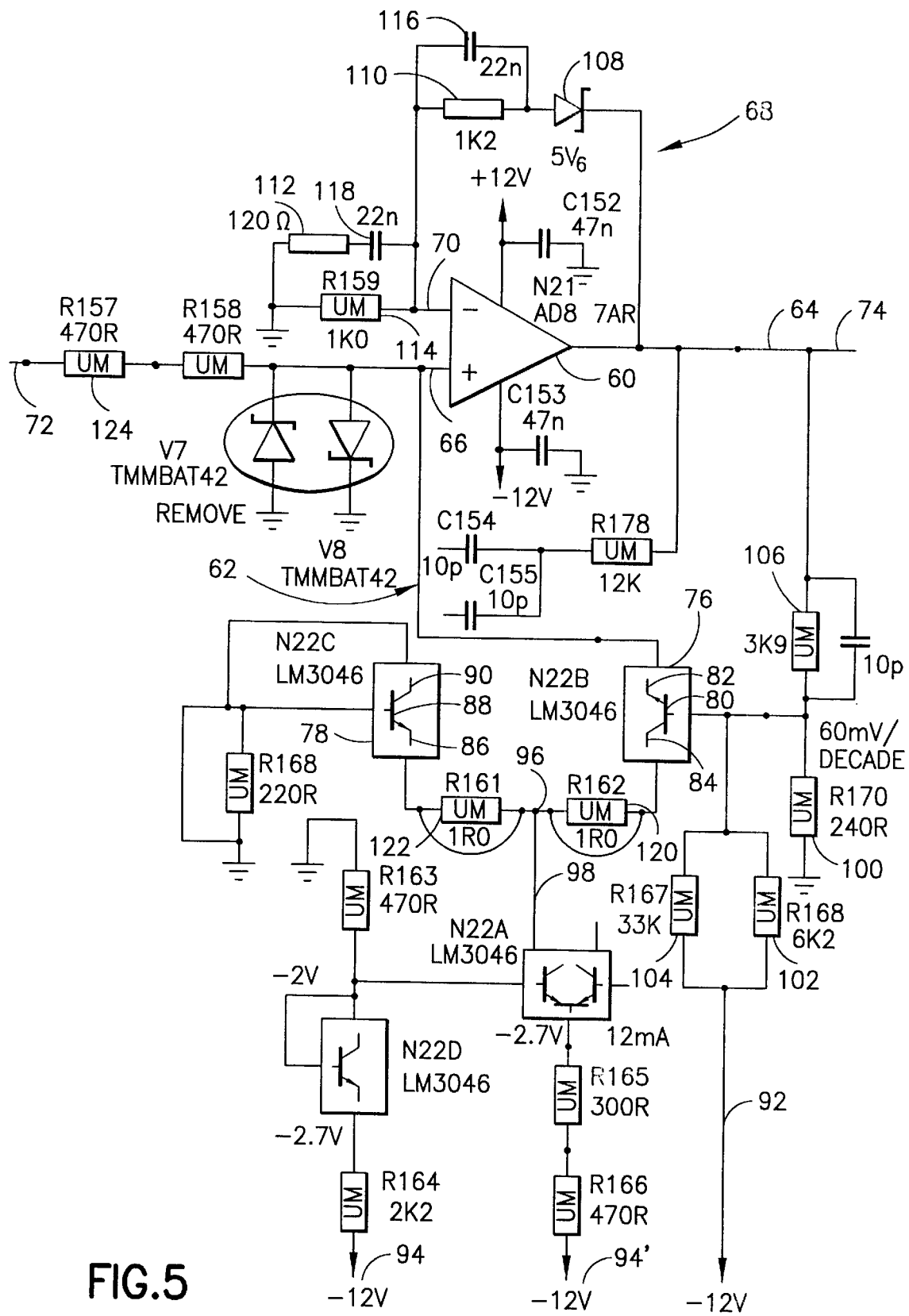
FIG. 5 is a diagram of a logarithmic converter in accordance with the invention, for use with the voltage controlled attenuator in the power control circuit to produce a circuit with a linear gain.

FIG. 5 shows a diagram of a logarithmic converter in accordance with the invention, used with the voltage controlled attenuator in the power control circuit shown in FIG. 1. The logarithmic converter shown is a non-inverting logarithmic converter with an operational amplifier 60 having a non-inverting input 66, an inverting input 70 and an output 64.

A first feedback means 62 is connected from the operational amplifier output 64 to the non-inverting input 66. A second feedback means 68 is connected from the output 64 to the inverting input 70 and thence to ground. An input signal 72 is supplied to the logarithmic converter circuit for amplification by the operational amplifier 60 and associated feedback means 68,62. This produces an output signal 74 which is used as the controlling voltage for a voltage controlled attenuator in a power control circuit as shown in FIG. 1.

The first feedback means 62 contains various reactive elements to provide a gain characteristic to match that of the non-linear gain VCA used in the power control circuit. N-p-n transistors 76,78 determine the principal characteristics of the first feedback means 62. The number of doping atoms in the base per unit area of the two n-p-n transistors 76,78 is equal, i.e. a matched pair of transistors is provided.

Transistor 76 is connected in the feedback means 62 so that the base 80 is connected to the output 64 and the collector 82 to the non-inverting input 66. The emitter 84 is connected in series with the emitter 86 of transistor 78. The base 88 and collector 90 of transistor 78 are connected to ground. Such emitter coupled transistors may be known as a long tailed pair (LTP). Resistive elements 100,102,104, and 106, typically resistors, are present in the first feedback means 62 and are connected to form an attenuator.

An inverted value of a control voltage 92 at which the sensitivity of the VCA is at a maximum is also supplied to the reactive components of the logarithmic converter. In addition a negative bias voltage 94, 94' is applied to the emitter coupled junction 96 so as to produce a tail current 98.

The second feedback means 68 comprises a reactive element 108, resistive elements 110,112 and 114, typically resistors, and capacitive elements 116 and 118, typically capacitors. The reactive element 108 is such that little current will flow through it until a certain critical voltage is reached at which point the reactive element 108 will conduct a large current. Such a reactive device is typically provided by a zener diode. The second feedback means 68 thus provides non-linear feedback into the inverting input 70.

In use, the operation of the logarithmic converter can be described as follows. At input voltages of less than 1V, the zener diode 108 will conduct little, if any, current and so the effect of the second feedback means 68 on the output of the operational amplifier 60 can be ignored. The input current to the logarithmic converter is less than or equal to 1 mA. This is also the value of the collector current for transistor 76 due to the feedback action of the circuit. Hence the bulk of the tail current 98 flows through transistor 78.

If the input voltage 72 doubles, then the percentage change in the collector current of transistor 78 will be small and hence its base emitter voltage will not change. This means that the emitter voltage of transistor 76 will also be steady. Hence for small input voltages less than 1V, the base voltage of transistor 76 increases at a rate of 60 mV per decade change in input voltage 72. This is the exponential transfer characteristic of the transistor 76, i.e. the non-linear gain that is introduced into the power control circuit of FIG. 1 to counteract the non-linear gain of the VCA and so produce a linear gain power transfer circuit.

Output gain from the logarithmic converter will be 1100 mV per decade change in input voltage 72 due to the potential divider between the operational amplifier 60 and the transistor 76.

As the input voltage 72 rises to around 3V, the collector current for transistor 76 increases to 3 mA. The collector current is now a significant fraction of the tail current 98. Hence the collector current for transistor 78 can no longer be considered constant as the input voltage 130 increases further. For an increase in input voltage there will be a reduction in the collector current of transistor 78 and the emitter voltage will rise slightly. The emitter voltage for transistor 76 therefore also increases. It can be seen that under these conditions as input voltage 72 rises, the base voltage for transistor 76 will have to increase at a rate greater than 60 mV per decade increase in input voltage. Hence log fidelity will be affected. Under these conditions the zener diode 108 begins to influence the circuit.

As the output voltage 64 rises above 5.6V, the zener diode 108 starts to conduct and so the voltage at the inverting input 70 of the operational amplifier 122 rises. Feedback action forces the potential at the non-inverting input 66 to increase also. This reduces the input current and hence the collector current for transistor 76. Thus conduction of the zener diode 108 tends to slow down the rate of increase in the output voltage 64. This helps to compensate for the problems caused by the emitter voltage of transistor 76 rising. The output voltage will now increase at a rate of about 1100 mV per decade increase in the input voltage over a greater range of input voltages. Correct selection of the values for resistor 114 and the resistor 110 in series with the zener diode 108 will enable the voltage feedback from the diode 108 to cancel out the effect of transistor 78 switching off.

Transfer characteristic of any negative feedback circuit will be determined by the feedback network as long as there is sufficient loop gain. At DC there is ample loop gain and all the circuit has a logarithmic characteristic due to the transistor in the feedback means 62. There are no reactive components in the feedback means 62 so the logarithmic converter will retain the same logarithmic characteristics from DC until the loop gain runs out. Hence the power control circuit can be linearised over all frequencies of interest not just DC.

At low level voltage inputs the circuit will be stable without any additional compensation, the zener diode 108 will have no current flow through it and capacitor 116 can be ignored. For increasing input voltage the transconductance of transistor 126 will increase and the Miller effect around the transistor will become significant. There will be a worsening phase shift in the feedback means 62 which will inevitably lead to oscillations at some input voltage. The solution is to reduce loop gain as the input voltage is increased. When the zener diode 108 starts to conduct, some local feedback will be added around the operational amplifier 60. This will reduce the loop gain as required to maintain stability of the whole circuit.

Emitter resistors at positions 120 and 122 may be used in the LTP to reduce the gain in the linear region and increase the width of the linear region. If no emitter resistors are used in the LTP, the gains in the linear and the nonlinear region have the same temperature sensitivity. However as with the standard logarithmic converter the gain is proportional to the absolute temperature. A thermistor may be provided to compensate for this.

An optional resistor 124 may be added into the circuit to shift the value of the input voltage 72, for example to simulate the VCA in the radio frequency leakage region.

It will be understood by persons skilled in the art that the logarithmic converter may be non-inverting, as in the example shown in FIG. 5, or inverting.

An inverting logarithmic converter will require the first feedback means to be provided between the output of the operational amplifier and the inverting input. The second feedback means will be connected between the output of the operational amplifier and the non-inverting input. In addition appropriate changes to the ground connections of the LTP will be required, namely connection of the collector of the transistor equivalent to transistor 78 in FIG. 5 to the inverting input of the operational amplifier, its base being connected to ground. The transistor equivalent to transistor 76 in FIG. 5 will have its collector connected to ground. This particular configuration of the LTP is the fastest.

It will also be understood that either n-p-n transistors or p-n-p transistors may be used with appropriate biasing arrangements. Those circuits containing n-p-n transistors will be faster than those using p-n-p transistor combinations. Further an inverting logarithmic converter will perform better than a non-inverting configuration.

Replacing the individual transistors used in the LTP with a Darlington transistor pair allows movement of the temperature insensitive point of the logarithmic converter. The Darlington two transistor configuration, where the emitter of one of the transistors forming the pair is connected to the base of the other transistor in the pair, is widely used in bipolar circuits to improve the effective current gain and input resistance of a basic bipolar transistor.

The circuit shown in FIG. 5 using the emitter coupled transistors is simpler and more accurate than a similar circuit using Darlington pairs as less transistors have to match. However a Darlington circuit gives an extra degree of freedom to match the temperature coefficient of the logarithmic converter to that of the VCA.

In addition the LTP can be replaced by a diode pair or diode bridge. If the diode bridge is used a positive bias voltage is used across the bridge configuration and an additional tail current flows. Such a logarithmic converter configuration has much larger settling times than the version using a LTP. The diode bridge arrangement is used if the exponential gain region of the VCA is small compared to the linear region and low cost is at a premium.

I claim:

1. A logarithmic converter for use in a closed loop power control circuit, the converter comprising amplifying means for amplifying an input signal, the amplifying means including at least non-inverting and inverting inputs and an output, and two feedback means, separably connected between the output and an input of the amplifying means, wherein one of the inputs receives the input signal, and the first feedback means produces a feedback signal which results in the amplifying means exhibiting a non-linear gain characteristic and the second feedback means contains at least one reactive element operable above a given input level, so that in use the second feedback means acts to limit the feedback signal from the first signal feedback means above certain signal levels.

2. A logarithmic converter according to claim 1, wherein the first feedback means is connected between the output and non-inverting input of the amplifying means, so that in use the logarithmic converter has a non-inverting gain.

3. A logarithmic converter according to claim 1, wherein the first feedback means is connected between the output and the inverting input of the amplifying means, so that in use the logarithmic converter has an inverting gain.

4. A logarithmic converter according to claim 1, wherein the first feedback means comprises reactive components including further amplification means.

5. A logarithmic converter according to claim 4, wherein the further amplification means is an emitter coupled pair of transistors.

6. A logarithmic converter according to claim 5, wherein resistive elements are placed in series with each emitter junction of the transistors in the first feedback means so as to equalise the sensitivity of the logarithmic converter to the sensitivity of a voltage controlled attenuation element in said power control circuit.

7. A logarithmic converter according to claim 4, wherein the further amplification means is provided by two Darlington transistor pairs, wherein each Darlington pair is coupled to the other by the unconnected emitters of the Darlington pairs, so as to produce a logarithmic converter where movement of a temperature independent point of the gain characteristic of the logarithmic converter is permitted.

8. A logarithmic converter according to claim 1, wherein the reactive element of the second feedback means is a zener diode so as to contain large increases in gain at higher output voltages.

9. A logarithmic converter according to claim 8, wherein the second feedback means is provided with at least one resistive element and at least one capacitive element so as to allow suppression of unwanted feedback from outside the second feedback means.

10. A logarithmic converter according to claim 1, said a power control loop circuit further containing a non-linear gain element for producing a gain in output power over input power, the combination of said logarithmic converter and said non-linear gain element results in a linear gain in output power over input power.

* * * * *

UNITED STATES PATENT AND TRADEMARK OFFICE
CERTIFICATE OF CORRECTION

PATENT NO. : 5,812,008
DATED : September 22, 1998
INVENTOR(S) : Toll

It is certified that error appears in the above-identified patent and that said Letters Patent is hereby corrected as shown below:

On the title page, item [19] should read  -- Toll --
               item [75] should read -- Nigel John Toll --

Signed and Sealed this

Twenty-sixth Day of January, 1999

Attest:

Attesting Officer

*Acting Commissioner of Patents and Trademarks*